(12) United States Patent
Pakala et al.

(10) Patent No.: US 7,282,755 B2
(45) Date of Patent: Oct. 16, 2007

(54) STRESS ASSISTED CURRENT DRIVEN SWITCHING FOR MAGNETIC MEMORY APPLICATIONS

(75) Inventors: Mahendra Pakala, San Jose, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 99 days.

(21) Appl. No.: 10/714,357

(22) Filed: Nov. 14, 2003

(65) Prior Publication Data

US 2005/0106810 A1    May 19, 2005

(51) Int. Cl.
H01L 29/76    (2006.01)
(52) U.S. Cl. .................. 257/295; 438/3; 257/421
(58) Field of Classification Search ............ 438/3; 365/158, 173
See application file for complete search history.

(56) References Cited

U.S. PATENT DOCUMENTS

| | | | | |
|---|---|---|---|---|
| 5,239,504 | A * | 8/1993 | Brady et al. ................ | 365/157 |
| 5,695,864 | A | 12/1997 | Slonczewski | |
| 6,532,164 | B2 * | 3/2003 | Redon et al. ................. | 365/97 |
| 6,625,058 | B2 * | 9/2003 | Iwasaki ....................... | 365/171 |
| 2002/0105827 | A1 | 8/2002 | Redon et al. | |
| 2002/0117727 | A1 | 8/2002 | Engel et al. | |
| 2003/0007398 | A1 | 1/2003 | Daughton et al. | |
| 2003/0059588 | A1 | 3/2003 | Hannah et al. | |
| 2004/0145850 | A1 * | 7/2004 | Fukumoto et al. .......... | 361/143 |
| 2005/0013062 | A1 * | 1/2005 | Gil ............................... | 360/324.12 |
| 2005/0052792 | A1 * | 3/2005 | Gill .............................. | 360/324.12 |
| 2006/0081953 | A1 * | 4/2006 | Nguyen et al. .............. | 257/421 |

FOREIGN PATENT DOCUMENTS

EP    1318523 A1    11/2003

OTHER PUBLICATIONS

*Quantitative Study of Magnetization Reversal by Spin-Polarized Current in Magnetic Multilayer Nanopillars*, F.J. Albert, N.C. Emley, E.B. Myers, D.C. Ralph and R.A. Buhrman, The American Physical Society, Physical Review Letters, vol. 89, No. 22, Nov. 25, 2002.

*Perpendicular Magnetic Anisotropy in Pd/Co Thin Film Layered Structures*, P.F. Carcia, A.D. Meinhaldt and A. Suna, American Institute of Physics, Appl. Phys. Lett. 47 (2), Jul. 15, 1985.

(Continued)

*Primary Examiner*—Thao P. Le
(74) *Attorney, Agent, or Firm*—Strategic Patent Group, P.C.

(57) ABSTRACT

A method and system for providing a magnetic memory is disclosed. The method and system include providing a plurality of magnetic elements and providing at least one stress-assist layer. Each of the plurality of magnetic elements is configured to be written using spin transfer. The at least one stress-assist layer is configured to exert at least one stress on at least one magnetic element of the plurality of magnetic elements during writing. The reduction of spin-transfer switching current is due to stress exerted by the stress-assist layer on the magnetic elements during writing. Stability of the magnetic memory with respect to thermal fluctuations is not compromised because the energy barrier between the two magnetization states is unchanged once the switching current is turned off.

23 Claims, 5 Drawing Sheets

OTHER PUBLICATIONS

*Origins of Perpendicular Magnetic Anisotrophy in Ni/Pd Multilayer Films*, Jong-Ryul Jeong, Young-Seok Kim and Sung-Chul Shin, Journal of Applied Physics, vol. 85, No. 8, Apr. 15, 1999.

*Current-Driven Magnetization Reversal and Spin-Wave Excitations in Co/Cu/Co Pillars*, J.A. Katine, F.J. Albert and R.A. Buhrman, The American Physical Society, Physical Review Letters, vol. 84, No. 14, Apr. 3, 2000.

*Voltage Control of a Magnetization Easy Axis in Piezoelectric/Ferromagnetic Hybrid Films*, Sang-Koog Kim, Jeong-Won Lee, Sung-Chul Shin, Han Wook Song, Chang Ho Lee, Kwangsoo No, Journal of Magnetism and Magnetic Materials, Jan. 2, 2003.

*Overlayer-Induced Anomalous Interface Magnetocrystalline Anisotropy in Ultrathin Co Films*, Lieping Zhong, Miyoung Kim, Xindong Wang and A.J. Freeman, The American Physical Society, Physical Review B, vol. 53, No. 15, Apr. 15, 1996.

J.F. Albert, et al, "Polarized Current Switching of a CO Thin Film Nanomagnet", American Institute of Physics, vol. 77, No. 23, Dec. 4, 2000, pp. 3809-3811.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

L. Berger, *Emission of spin waves by a magnetic multilayer traversed by a current,* The American Physical Society, Physical Review B, vol. 54, No. 13, Oct. 1996, pp. 9353-9358.

\* cited by examiner

STRESS ASSISTED CURRENT DRIVEN SWITCHING FOR MAGNETIC MEMORY APPLICATIONS

FIELD OF THE INVENTION

The present invention relates to magnetic memory systems, and more particularly to a method and system for providing an element that employs a stress-assisted spin transfer effect in switching and that can be used in a magnetic memory such as magnetic random access memory ("MRAM").

BACKGROUND OF THE INVENTION

Figure 1A:
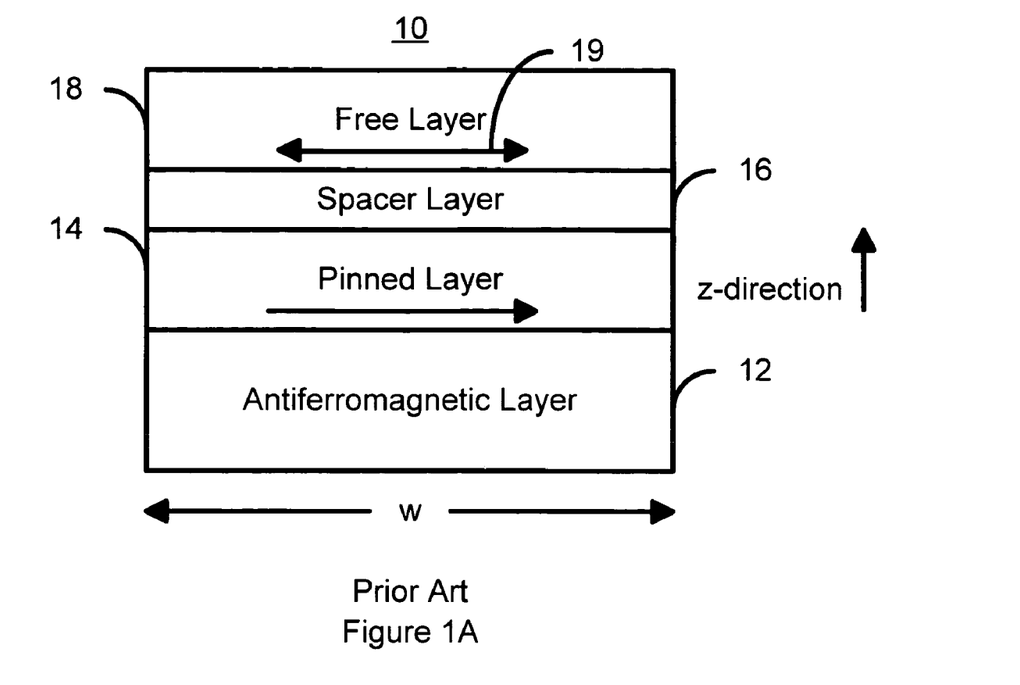
FIG. 1A is a diagram of a conventional magnetic element, a spin valve.
Figure 1B:
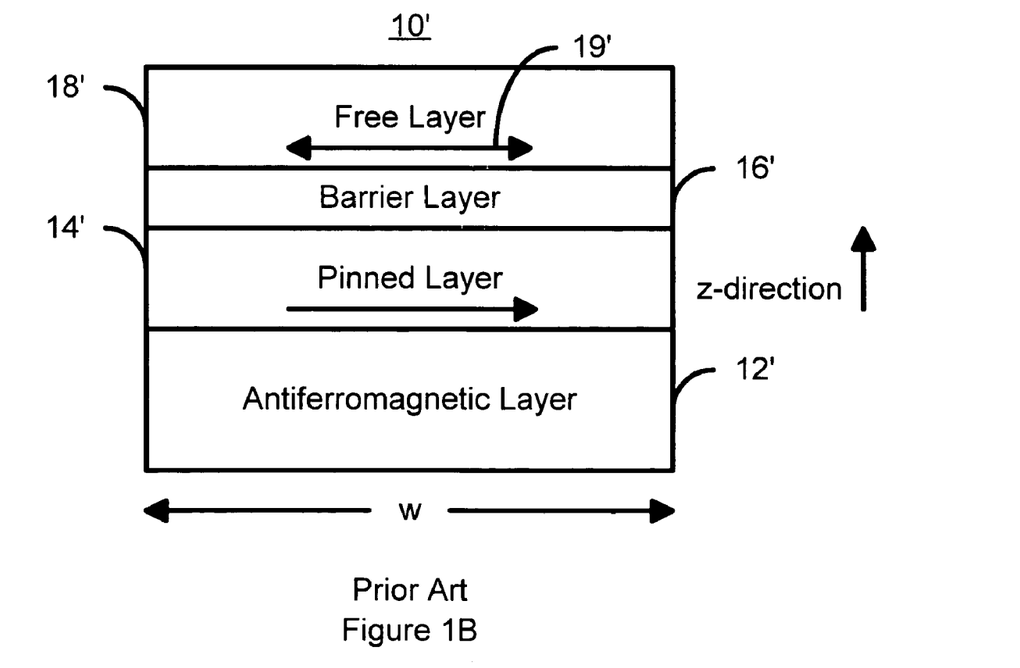
FIG. 1B is a diagram of another conventional magnetic element, a spin tunneling junction.

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel with the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Current can be driven in one of two configurations, current in plane ("CIP") and current perpendicular to the plane ("CPP"). In the CPP configuration, current is driven perpendicular to the layers of conventional magnetic element 10/10' (up or down as seen in FIG. 1A or 1B). Typically, in memory applications, such as magnetic random access memory (MRAM) applications, the conventional magnetic elements 10 and 10' are used in the CPP configuration.

In order to overcome some of the issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from a direction antiparallel to the magnetization of the conventional pinned layer 14' to a direction parallel to the magnetization of the conventional pinned layer 14'. Current is driven from the conventional free layer 18' to the conventional pinned layer 14' (conduction electrons traveling from the conventional pinned layer 14' to the conventional free layer 18'). Thus, the majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions, one of ordinary skill in the art will readily recognize that it may be relatively difficult to write to the conventional magnetic elements 10 and 10'. In particular, the magnetization may be difficult to switch at a low current, as will be described. When switching the magnetization 19' of the conventional free layer 18' to be parallel to the magnetization of the conventional pinned layer 14', the conventional pinned layer 14' acts as a source of spin polarized electrons and the conventional free layer 18' acts as the target. The spin transfer phenomena in this configuration can be described by modifying the Landau Lifshitz Gilbert (LLG) equation of spin dynamics to include a spin-torque term resulting from the spin-polarized current, as given in the publication: J. A. Katine F. J. Albert, R. A. Buhrman, E. B. Myers and D. C. Ralph, "Current-Driven Magnetization Reversal and Spin-Wave Excitations in Co/Cu/Co Pillars," *Physics Review Letters*, vol. 84, p3149 (2000). For the magnetic elements 10 and 10', the film plane is along the x-y plane. The z-direction is directed upwards (perpendicular to film plane) in FIG. 1B. The dynamics of the total magnetic moment, S, of the conventional free layer 18' is described by:

$$dS/dt = S \times \{\gamma[H_{eff//}x - 4\pi M(S \cdot z)z] - \alpha dS/dt - [I g/e |S|]z \times S\} \quad (1)$$

The first term in equation (1) describes the steady state precession of spin moment and includes torque from all the fields acting on the magnetization 19' of the conventional free layer 18'. The field $H_{eff//}$ includes an anisotropy field ($H_{an}$), an exchange ($H_{ex}$) and an applied field ($H_{ap}$) aligned along easy axis of free layer in the film plane. The $4\pi M$ term refers to the out-of-plane demagnetization field for the free layer 18', acting perpendicular to the plane of the free layer, along the z-direction. The demagnetization field results in a shape anisotropy of $2\pi M^2$ for the film. The second term is the phenomenological damping effect. Here $\alpha$ is damping coefficient of the ferromagnet. The third term is the spin-torque acting on the moment of the ferromagnet as result of the spin polarized current I, where g is the spin transfer efficiency.

The switching of the direction of the magnetization 19' of the conventional free layer 18' occurs when the torque exerted by the current of spin polarized electrons exceeds the damping, which is described by the $\alpha dS/dt$ term in equation (1). When the torque from the current exceeds the damping, the torque causes an outward precession of the magnetic moment of free layer 18'. As a result, at a critical minimum value of the current ($I_c$), termed the switching current herein, the magnetization direction of the conventional free layer 18' is switched. Thus, the magnetization 19' of the conventional free layer 18' can switch direction due to spin transfer.

The switching current $I_c$ is the minimum current required to switch the direction of the magnetization 19' of the conventional free layer 18' using spin transfer. From energy considerations, the dependence of the switching current on $H_{eff}$ and the demagnetization field is given by:

$$I_c \propto \alpha M \, t(H_{eff//} + 2\pi M) \quad (2)$$

Thus, the switching current is proportional to the saturation magnetization of the conventional free layer 18', the thickness (t) of the conventional free layer 18', the damping coefficient ($\alpha$), the effective demagnetizing field perpendicular to the plane (through the $2\pi M$ term) and the effective field in the plane of the conventional free layer 18', $H_{eff//}$.

Although conventional magnetic elements can use spin transfer as a switching mechanism, the switching current is high due to the large value of $2\pi M$ term. For a number of reasons, a high switching current is undesirable for magnetic memory application. Accordingly, what is needed is a system and method for providing a magnetic memory element that can be more easily switched using spin transfer at a low switching current. The present invention addresses the need for such a magnetic memory element.

SUMMARY OF THE INVENTION

The present invention provides a method and system for providing a magnetic memory. The method and system comprise providing a plurality of magnetic elements and providing at least one stress-assist layer. Each of the plurality of magnetic elements is configured to be written using spin transfer. The at least one stress-assist layer is configured to exert at least one stress on at least one magnetic element of the plurality of magnetic elements during writing.

According to the system and method disclosed herein, the present invention provides a magnetic element that is capable of being written using a reduced current and that remains stable after being written.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic memory. The method and system comprise providing a plurality of magnetic elements and providing at least one stress-assist layer. Each of the plurality of magnetic elements is configured to be written using spin transfer. The at least one stress-assist layer is configured to exert at least one stress on at least one magnetic element of the plurality of magnetic elements during writing.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements, bit lines, and word lines. However, one of ordinary skill in the art will readily recognize that the present invention is consistent with the use of magnetic memories having multiple elements, bit lines, and word lines.

Figure 2:
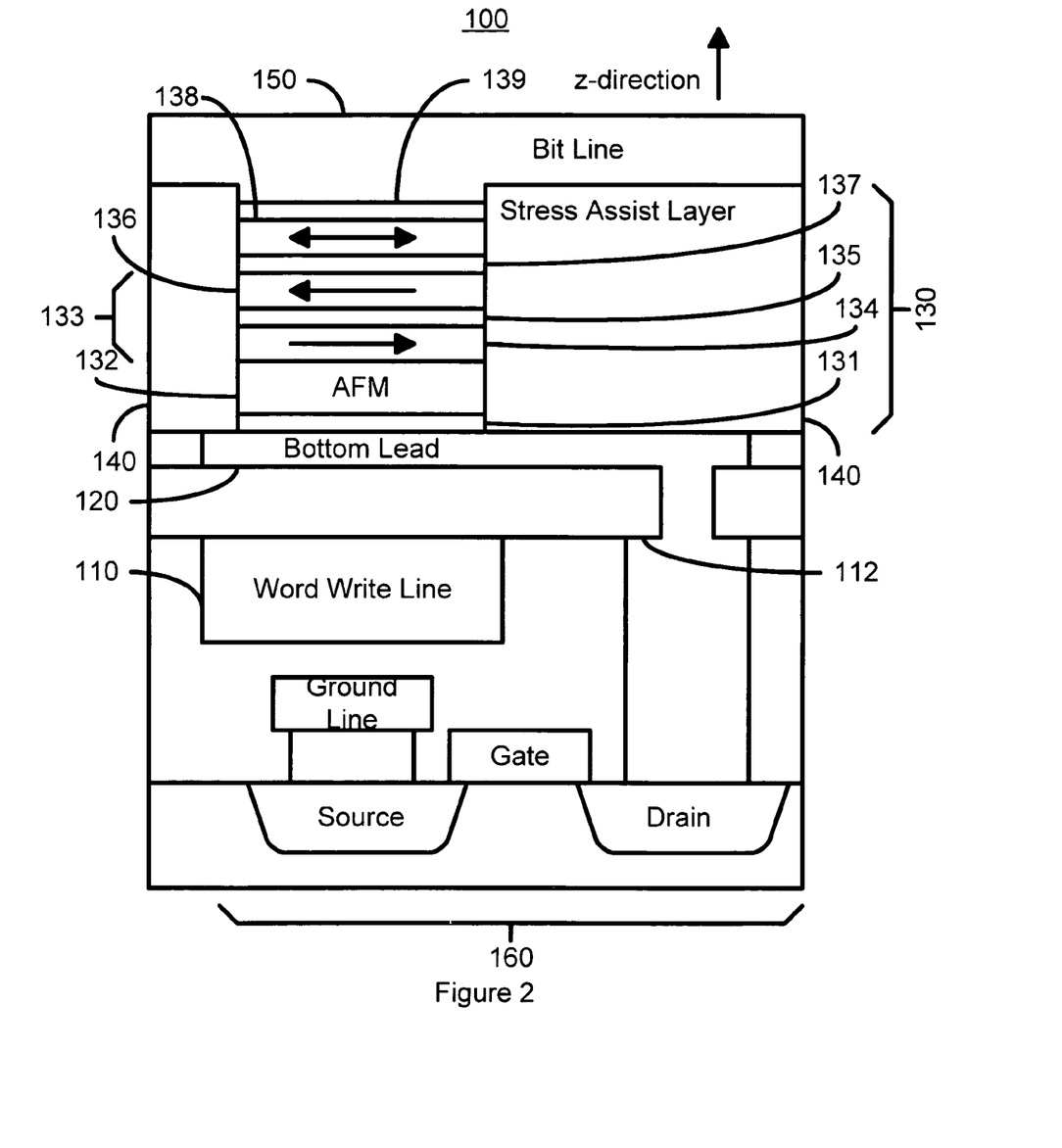
FIG. 2 is a diagram depicting one embodiment of a portion of a magnetic memory utilizing stress assisted switching in accordance with the present invention.

To more particularly illustrate the method and system in accordance with the present invention, refer now to FIG. 2, depicting one embodiment of a portion of a magnetic memory 100 utilizing stress assisted switching in accordance with the present invention. The magnetic memory 100 is preferably a MRAM. The magnetic memory 100 includes word write line 110, bottom lead 120, magnetic element 130 surrounded by stress-assist layer 140 and a bit line 150. Although specific word write line 110, bottom lead 120, magnetic element 130, and bit line 150 are depicted, one of ordinary skill in the art will readily recognize that the present invention is consistent with other architectures using other and/or additional elements. The bottom lead 120 is separated from the word write line 110 by insulator 112 and is connected to a transistor 160. Thus, in a preferred embodiment, a magnetic memory cell includes both the magnetic element 130 and the transistor 160. However, nothing prevents the use of another component in lieu of or in addition to the transistor 160 or the omission of the transistor 160 as part of the magnetic memory cell in another architecture.

The magnetic element 130 shown is a spin tunneling junction. However, in an alternate embodiment, the magnetic element 130 could include other structures which develop a finite voltage under the application of a current, as described below. The magnetic element 130 includes a bottom seed layer 131, an AFM layer 132, a pinned layer 133, a barrier layer 137, a free layer 138, and a top capping layer 139. The AFM layer 132 is preferably PtMn, but could include other antiferromagnets such as PdMn, PdPtMn, NiMn and IrMn or other antiferromagnetic materials. The preferred AFM material is IrMn and PtMn.

The pinned layer 133 depicted is a synthetic antiferromagnet, including two ferromagnetic layers 134 and 136 separated by a nonmagnetic spacer layer 135. The ferromagnetic layers 134 and 136 are preferably Co or CoFe, while the nonmagnetic spacer layer 135 is an antiferromagnetic coupling material such as Ru, Os, Re, Cr, Rh, Cu and Ir. The preferred material is Ru. The barrier layer 137 is an insulator that is preferably $Al_2O_3$ and is thin enough to allow tunneling through the barrier layer. The free layer 138 is a ferromagnetic material containing at the least one of these elements: Co, Fe or Ni and is preferably capped by Ta film. The composition of free layer is preferably adjusted to obtain a high positive magnetostriction.

The magnetic memory 100 also includes a stress-assist layer 140. The stress-assist layer 140 provides a tensile stress perpendicular to the plane, in the direction of current flow through the magnetic element 130. Thus, the stress provided is perpendicular to the plane in which the magnetization of the free layer 138 lies at equilibrium. In an alternate embodiment, the stress need not be perpendicular, but simply have a component perpendicular to the plane in which the magnetization of the free layer 138 lies at equilibrium. In a preferred embodiment, a piezoelectric or electrostrictive material(s) is (are) used for the stress-assist layer 140. In addition, the material(s) used for the stress-assist layer 140 have good insulating properties to ensure that the magnetic element 130 is adequately insulated. In a preferred embodiment, the stress-assist layer 140 includes a bilayer of $IrO_2$/PZT, MnO/PZT, $TiO_y$/PZT, $Al_2O_3$/PZT, $Al_2O_3$/PMN, $Al_2O_3$/SrBaTiO_3, $SiO_2$/PZT or $SiO_2$/SrBaTiO_3. The material PZT is $PbZr_{1-x}Ti_xO_3$, where x is a fraction less than one, as a basic material with dopant added to enhance the dielectric properties of PZT. The material PMN is $PbMn_{1-x}Nb_xO_3$ with $PbTiO_3$, where x is a fraction less than one. The bottom layer of the bilayer acts as diffusion barrier, insulator and/or seed layer.

In operation, the magnetic element 130 is written using a current driven between the bit line 150 and the bottom lead 120. For example, the data stored is either a "1" or a "0", depending on direction of magnetization of free layer 138 with respect to the pinned layer 133. When the direction of the applied current is from the bit line 150 to the bottom lead 120, (the electrons travel from bottom to top), at a critical current the magnetization direction of the free layer 138 aligns with the magnetization direction of the top ferromagnetic layer 136 of the pinned layer 133. Thus, if the magnetization of the free layer 138 was initially antiparallel (for example, representing data "1"), the magnetization switches direction to become parallel to the pinned layer 133 (representing data "0"). To change the direction of magnetization of the free layer 138 again, the direction of current is reversed. If the current direction is from the bottom lead 120 to the bit line 150, the electrons having spins opposite to the magnetization of the top ferromagnetic layer 136 of the pinned layer 133 are reflected back. These reflected electrons exert a torque on the moment of free layer 138 causing it to switch at another critical current value. The magnetization of the free layer 138 thus becomes aligned anti-parallel to the magnetization of the top ferromagnetic layer 136 of the pinned layer 133 (representing data "1").

The stress-assist layer 140 aids in switching the magnetization of the free layer 138 regardless of the direction of flow of current. When current flows from the bit line 150 to the bottom lead 120 or vice versa, the presence of the barrier layer 137 causes a finite voltage difference to develop between the bit line 150 and the bottom lead 120. This voltage difference effectively exists across the stress-assist layer 140. Because the stress-assist layer 140 is a piezoelectric/electrostrictive material, the voltage difference induced by the application of current between the bit line 150 and the bottom electrode 120 causes the stress-assist layer 140 to expand parallel to the direction of the electric field. The expansion of the stress-assist layer 140 causes tensile stress in the magnetic element 130 along the direction perpendicular to the films 131–139. Either direction of current flow causes the expansion in the stress-assist layer 140 along the z-direction and, therefore, tensile stress in the magnetic element 130 along the z-direction. Furthermore, because the tensile stress is due to the voltage difference between the bit line 150 and the bottom lead 120, the tensile stress does not exist in the absence of a current.

This tensile stress aids in switching the magnetization of the free layer 138 during writing, but does not affect the magnetic element 130 when the magnetic element 130 is in a quiescent state. The tensile stress introduces a transient anisotropy that reduces the perpendicular anisotropy and, hence reduces the effective field term (which includes $2\pi M$ term) in the direction perpendicular to the plane. As a result, it becomes easier to switch the direction of the magnetization of the free layer 138. In particular, the spin-transfer switching current used to write to the free layer 138 is reduced. Furthermore, because the anisotropy induced by the tensile stress is only introduced when the current is driven through the magnetic element 130, the state of the magnetic element 130 in the absence of a current is unaffected. Thus, the stability of the magnetic element 130 is not adversely affected by this scheme of lowering of the switching current.

To further reduce the switching current, the free layer 138 can be a bi-layer including a ferromagnetic layer containing at the least one of Fe, Co or Ni based alloy and a non-magnetic layer on top, for example: Co/Au, CoFe/Pt, CoFe/Pd, CoFe/Cu, CoFe/Au, Co/Pt, CoPd/Pd, CoPd, CoFe or Co. The top layer of the bi-layer is preferably in the range of few angstroms to change the surface anisotropy of the free layer 138. However, nothing prevents the use of a free layer 138 without the top layer used to change the surface anisotropy of the free layer 138. The above bi-layer could be repeated 'n' times such that a representative structure of free layer 138 would be (Co/Pt)n, where n is an integer. Further, the ferromagnetic material of the bi-layer can actually itself be a two layer structure, such that a representative whole structure of free layer 138 would be NiFe/Co/Au. The composition of the free layer 138 is preferably adjusted to obtain a high positive magnetostriction.

The effect of stress on the spin-transfer switching current of the magnetization of the free layer 138 can be more particularly explained based on the effective anisotropy as follows. In films with nano-dimensions, such as the free layer 138, the anisotropy energy is generally a summation of shape anisotropy, crystalline anisotropy, surface anisotropy and induced anisotropy. The induced anisotropy could, for example, result from a field being applied during deposition of the free layer 138. Although the total anisotropy is a summation of the above anisotropies, the total anisotropy is controlled by the largest anisotropy when the largest anisotropy outweighs the combination of the remaining anisotropies. In such a case, a lower energy and thus a more stable state occurs when the magnetic moment of the free layer 138 is aligned such that the effect of largest anisotropy is minimized. Normally the effective or total perpendicular anisotropy (including anisotropy due to the $4\pi M$ demagnetizing field perpendicular to film plane) is significantly larger than the effective anisotropy along the plane of the film. Hence the plane of the film is the preferred plane of magnetization. Thus the total perpendicular anisotropy controls the switching current in normal conditions.

The tensile stress acts by introducing a perpendicular anisotropy. However, the perpendicular anisotropy introduced by the tensile stress is transient. The transient perpendicular anisotropy is present while a current is driven between the bit line 150 and the bottom lead 120 and the stress-assist layer 140 is subjected to a voltage difference. For a stressed magnetic film with a large magnetostriction, the effect of a stress-induced anisotropy (introduced via reverse magnetostriction or magneto-elastic effect) changes the anisotropy balance. In particular, the stress-induced anisotropy can be designed, as described below, to act in a direction opposing the perpendicular anisotropy resulting from the $4\pi M$ demagnetizing field. Hence the effective or total perpendicular anisotropy would be reduced in the presence of stress, which would allow for an even easier switching of the free layer 138 magnetization.

Another complementary mechanism for reducing the effective perpendicular anisotropy is changing the surface anisotropy of the free layer 138. For example, a nonmagnetic layer could be provided on top of the free layer 138. Certain non-magnetic layers reduce the total perpendicular anisotropy of the free layer by introducing a surface anisotropy. The surface anisotropy acts along the axis perpendicular to film plane, however in a direction opposite to the anisotropy resulting from the $4\pi M$ demagnetizing field. In the bi-layer free layers discussed above, such as Co/Pt, Co/Au, (Co/Pt)n CoFe/Pd, CoFe/Cu, CoFe/Au, Co/Pt, CoPd/Pd, CoPd, or CoFe, the top layer (e.g., Pt or Pd) reduces the effective perpendicular anisotropy of the free layer 138.

In terms of effective field, the perpendicular effective field due to various perpendicular anisotropy contributions can be expanded from equation (2) and expressed as:

$$H_{eff\perp} \sim 2\pi M + H_{san\perp} + H_s \quad (3)$$

The field $H_{san\perp}$ is the perpendicular effective field due to surface anisotropy term acting along perpendicular direction. As discussed above, the surface anisotropy term for the free layer 138 results from the use of a non-magnetic capping layer. The field $H_s$ is an equivalent field along the perpendicular direction due to effect of perpendicular magneto-elastic energy. Stated differently, the field $H_s$ is due to the stress-assist layer 140 under the influence of an electrical potential difference, as described above. Note by selecting appropriate materials for the free layer, $H_{san\perp}$ and $H_s$ are preferably designed to act in a direction opposing the demagnetizing field, irrespective of whether the component of demagnetizing field ($4\pi M$) acts in the +z or −z direction during precession. The field $H_s$ is given by $$H_s \sim -3 \lambda \sigma / 2M \quad (4)$$

The sign and, therefore, the direction of $H_s$ depend on sign of $\lambda\sigma$ product. The anisotropy induced by the tensile stress can thus be used to either increase or decrease the effective field along the direction perpendicular to the plane of the layers, depending on the sign of $\lambda$. Preferably, $H_s$ is used to reduce the perpendicular anisotropy for the free layer 138. In particular, the tensile stress in combination with a free layer having a positive magnetostriction are used to offset the shape anisotropy corresponding to the $4\pi M$ demagnetizing field perpendicular to the plane. Thus, the material and stress combination can be selected to provide a positive $\lambda\sigma$ along the perpendicular direction. Consequently, the effective field $H_{\mathit{eff}\perp}$ corresponding to the perpendicular anisotropy can be reduced.

The field $H_s$ acts opposite to the demagnetization field, thereby reducing the effective field $H_{\mathit{eff}\perp}$ along the direction perpendicular to the film. Consequently, the current required to switch the direction of the magnetization can be decreased by careful selection of the stress and the material for the free layer 138. Consequently, a more complete version of equation (2) for the switching current is given by:

$$I_c \propto \alpha Mt(H_{\mathit{eff}/\!/} + H_{\mathit{eff}\perp}) \quad (4)$$

Because the term $H_{\mathit{eff}\perp}$ can be reduced by the tensile stress and the capping layer for the free layer 138, the switching current is also reduced. Thus, through the use of the stress-assist layer 140, and the capping layer on the free layer 138, the switching current can be reduced. In addition, because the effective field $H_s$ is only present during writing, the use of the stress-assist layer 140 does not adversely affect the performance of the magnetic memory 100 when it is not being written.

For example, it is assumed that the free layer 138 has a thickness of between approximately ten and thirty Angstroms and is made of Co. The nominal energy values corresponding to the demagnetization field ($4\pi M$), $H_{san\perp}$, and $H_s$ are listed in Table 1.

Note that the finite value of $E_s$ in the "without external stress" case of Table 1 is due to the intrinsic stress (generally compressive along the film plane and thus tensile in the perpendicular direction) present in the insulator layers around the magnetic element 130. The value of $E_s$ can be optimized (for example by increasing the compressive stress along plane of film by deposition parameter variation). Thus, together with the free layer 138 having a positive magnetostriction as described earlier, the intrinsic stress can assist in lowering the switching current. The use of the intrinsic stress would be a passive method of switching current reduction as opposed to the preferred embodiment, which actively reduces the switching current through the use of a piezoelectric or electrostrictive material.

Note that the uniformity of the stress induced perpendicular anisotropy field across a wafer depends on the composition control of the free layer 138 (the magnetostriction control) and stress-assist layer 140 (stress control). These parameters can be controlled to get within ten percent of the nominal stress value and stress anisotropy value across a six inch wafer. Thus, the magnetic memory 100 can be fabricated using conventional processes.

Figure 3:
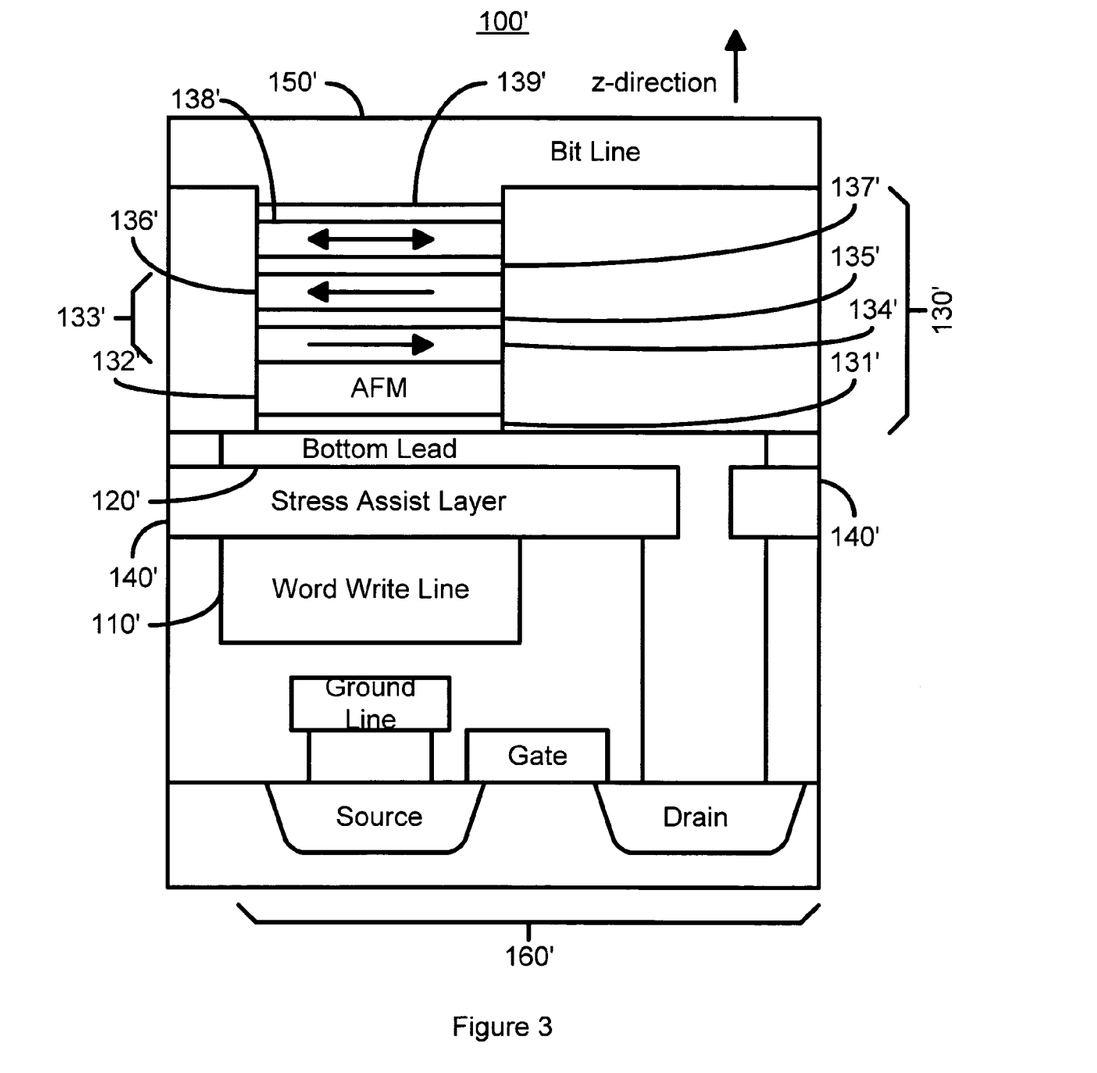
FIG. 3 is a diagram depicting a second embodiment of a portion of a magnetic memory utilizing stress assisted switching in accordance with the present invention.

FIG. 3 is a diagram depicting a second embodiment of a portion of a magnetic memory 100' utilizing stress-assisted switching in accordance with the present invention. The magnetic memory 100' is analogous to the magnetic memory 100 depicted in FIG. 2. Consequently, components of the magnetic memory 100' are labeled in an analogous manner. In addition, the materials used for the components of the memory 100' are preferably the same as for analogous components in the memory 100. However, note that the layer 137' can be either a barrier layer or a conducting spacer layer, for example made of Cu. Thus, the magnetic element 130' is preferably either a spin tunneling junction or a spin valve. Note, however, that in an alternate embodiment, other structures could be use for the magnetic element 130'. In addition, the stress-assist layer 140' is placed below the

TABLE 1

| Parameter | Magnetic Memory 100 | Without External Stress |
| --- | --- | --- |
| $2\pi M^2$ ($M \sim 1400$ emu/cm$^3$) | $+1 \times 10^7$ ergs/cm$^3$ | $+1 \times 10^7$ ergs/cm$^3$ |
| $E_{san\perp}$ (using 0.3 ergs/cm$^2$) | $-1.5 \times 10^6$ ergs/cm$^3$ | $-1.5 \times 10^6$ ergs/cm$^3$ |
| $E_s$ ($\lambda \sim 1 \times 10^{-5}$, $\sigma \sim 1 \times 10^{11}$ dynes/cm$^2$) | $-1.5 \times 10^6$ ergs/cm$^3$* | $-1.5 \times 10^4$ ergs/cm$^3$ |

*stress is only present during switching

Thus in terms of equivalent field, for a Co free layer 138, the fields are given by: $4\pi M$ is approximately 15 k Oe, $H_{san\perp}$ is approximately $-2$ kOe, and $H_s$ is approximately $-2$ kOe. Note the different signs of the anisotropy energies in Table 1. Thus the effective fields due to the stress-assist layer 140 during writing and the surface anisotropy due to the capping layer for the free layer 138 both reduce the effect of the demagnetization field. As a result, approximately a thirty percent reduction is expected in switching current values because the $4\pi M$ term of the demagnetization field is generally significantly larger than the in-plane anisotropy $H_{\mathit{eff}/\!/}$. Further optimization of the layers would result in a further reduction in the out-of-plane anisotropy field. For example, the materials used in the bilayer of the free layer 138 could be altered and the piezoelectric/electrostrictive material for the stress-assist layer 140 could be optimized, potentially resulting in a greater than fifty percent reduction in switching current.

bottom lead 120'. However, the stress-assist layer 140' still has the same function. Thus, the stress-assist layer 140' still causes the magnetic element 130' to deform under the application of a write current between the bit line 150' and the bottom lead 120'. Thus, the stress-assist layer 140' still reduces the switching current for the memory 100'.

In operation, the magnetic memory 100' functions in a similar manner to the magnetic memory 100 and utilizes similar principles. However, the stress-assist layer 140' utilizes a voltage difference between the word write line 110' and the bottom lead 120'. In particular, during writing, the word write line 110' is kept at a lower potential than the magnetic element 130' and, therefore, the bottom lead 120'. This potential difference is supported regardless of the direction of current being driven through the magnetic element 130'. Thus, a current driven through the magnetic element 130' causes the piezoelectric or electrostrictive material in the stress-assist layer 140' to contract in the direction parallel to the plane of the film. Because the stress-assist layer 140' contracts along the film plane (horizontally in FIG. 3), the contraction causes an expansion along the perpendicular direction in the region above the stress-assist layer 140'. Due to the contraction of the stress-assist layer 140' along the plane, the magnetic element 130' is compressed along the plane which results in expansion in the z-direction of the magnetic element. Thus, the free layer 138' is still subject to a tensile stress perpendicular to the plane of the layers. Consequently, the magnetization of the free layer 138' is more easily switched. Furthermore, the free layer 138' could include a capping layer that reduces the surface anisotropy of the free layer 138', further reducing the switching current for the magnetic element 130'.

Thus, the magnetic memory 100' has a reduced switching current due to the stress-assist layer 140'. The stress-assist layer 140' allows the reduction in the perpendicular anisotropy only while current is driven through the magnetic element 130'. Thus, the stability of the magnetic element 130' is not adversely affected by the use of the stress-assist layer 140'. In addition, the stress-assist layer 140' is controlled by a potential difference between the bottom lead 120' and the word write line 110'. Thus, control of the stress can be electrically separated from the application of spin-transfer switching current through the magnetic element 130'. As a result, the circuit for switching the magnetic element 130' is relatively isolated from the resonance that may be caused during high frequency operation of the stress-assist layer. Other means of improving high frequency switching characteristics include patterning the stress-assist layer and material selection with optimum dielectric properties. Thus, the performance of the magnetic element 130' can be further improved.

Figure 4A:
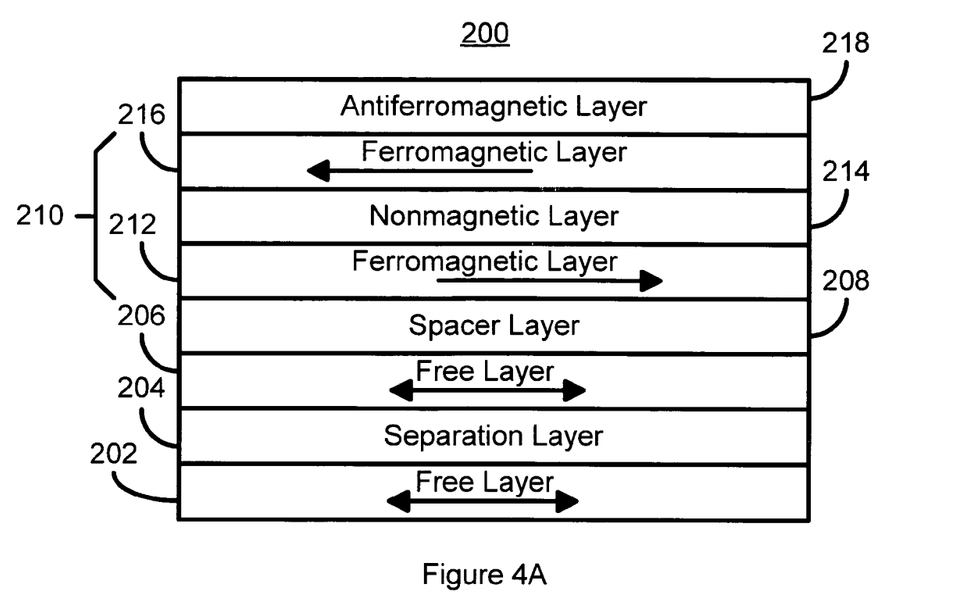
FIG. 4A is a diagram depicting a first embodiment of an alternate structure for use in a portion of the magnetic element for a magnetic memory utilizing stress assisted switching in accordance with the present invention.

FIG. 4A is a diagram depicting a first embodiment of an alternate switching element 200 in a magnetic element for a magnetic memory utilizing stress assisted switching in accordance with the present invention. The alternate element 200 could replace certain layers in the magnetic element 130 or 130' including the free layer 138 or 138', respectively. Thus free layer 202 of magnetic element 200 would be on top of layers 137 or 137' in the magnetic element 130 or 130', respectively. The alternate switching element 200 includes a ferromagnetic layer 202, a separation layer 204, a second ferromagnetic layer 206, a spacer layer 208, a pinned layer 210, and an AFM layer 218. The pinned layer 210 is preferably synthetic and, therefore, includes ferromagnetic layers 212 and 216 separated by a nonmagnetic layer 214. The free layer 206 preferably includes materials such as those used for the free layer 138 or 138'. The separation layer 204 preferably includes Cu or CuPt. The separation layer is used to allow the first free layer 202 and the second free layer 206 to be magnetostatically coupled such that their magnetizations are aligned antiparallel. The second free layer 202 preferably includes CoFe or Co. The spacer layer 208 is preferably Cu.

Referring to FIGS. 2, 3 and 4A, when using the alternate switching element 200 in the magnetic element 130 or 130', the magnetic element 130 or 130' effectively includes a spin tunneling junction portion and a spin valve portion. The spin tunneling junction portion includes layers 131, 132, 133, 134, and 202, while the spin valve portion includes the layers 206, 208, 210, and 218. Use of the magnetic element 200 allows the spin valve portion to be separately optimized from the spin tunneling junction portion. In particular, the spin valve portion can be optimized for a low switching current, while the spin tunneling junction portion can be optimized for a higher signal. Thus, performance of the magnetic element 130 or 130' may be further improved.

Figure 4B:
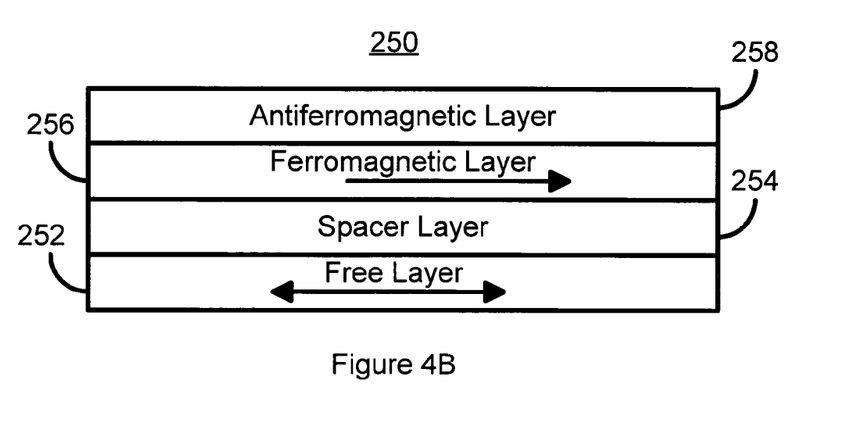
FIG. 4B is a diagram depicting a second embodiment of an alternate structure for use in a portion of the magnetic element for a magnetic memory utilizing stress assisted switching in accordance with the present invention.

FIG. 4B is a diagram depicting a second embodiment of an alternate switching element 250 in a magnetic element for a magnetic memory utilizing stress-assisted switching in accordance with the present invention. The alternate switching element 250 could thus replace layers in the magnetic elements 130 or 130', including the free layer 138 or 138', respectively. Thus, free layer 252 of magnetic element 250 would be on top of layers 137 or 137' in the magnetic element 130 or 130', respectively. The alternate magnetic element 250 includes a free layer 252, a spacer layer 254 that is nonmagnetic, a pinned layer 256, and an AFM layer 258. The free layer 252 preferably includes materials such as those used for the free layer 138 or 138'. The spacer layer 254 preferably includes Cu. The pinned layer 256 preferably includes CoFe. Alternatively, the pinned layer could be in the form of a synthetic antiferromagnet, comprising of three ferromagnetic layers, such as CoFe, separated by two antiferromagnetic coupling layers, such as Ru.

Referring to FIGS. 2, 3 and 4B, when using the magnetic element 250 as described above, the magnetic element 130 or 130' effectively includes a spin tunneling junction portion and a spin valve portion with a shared free layer. The spin tunneling junction portion includes layers 131, 132, 133, 134, and 252, while the spin valve portion includes the layers 252, 254, 256, and 258. The portions 134 or 134' of the pinned layer 133 or 133', respectively, and the pinned layer 256 are oriented in the same direction. Thus, the portions 136 or 136' of the pinned layer 133 or 133' and the pinned layer 256 are oriented in opposite directions. The spin valve portion and spin tunneling potion thus can both contribute to the spin transfer induced switching of the free layer 138 or 138' while the AFM layers 218 and 258 can be aligned in the same step as the AFM layer 132 or 132'. During programming, electrons from two pinned layers 136 and 256 incident on the free layer 252 have the same spin orientation for either direction of flow of current. As a result, the current required to switch the direction of the magnetization of the free layer 252 is further reduced. Moreover, use of the magnetic element 250 allows the spin valve portion to be separately optimized from the spin tunneling junction portion. In particular, the spin valve portion can be optimized for a low switching current, while the spin tunneling junction portion can be optimized for a higher signal. Thus, performance of the magnetic element 130 or 130' may be further improved.

Figure 5:
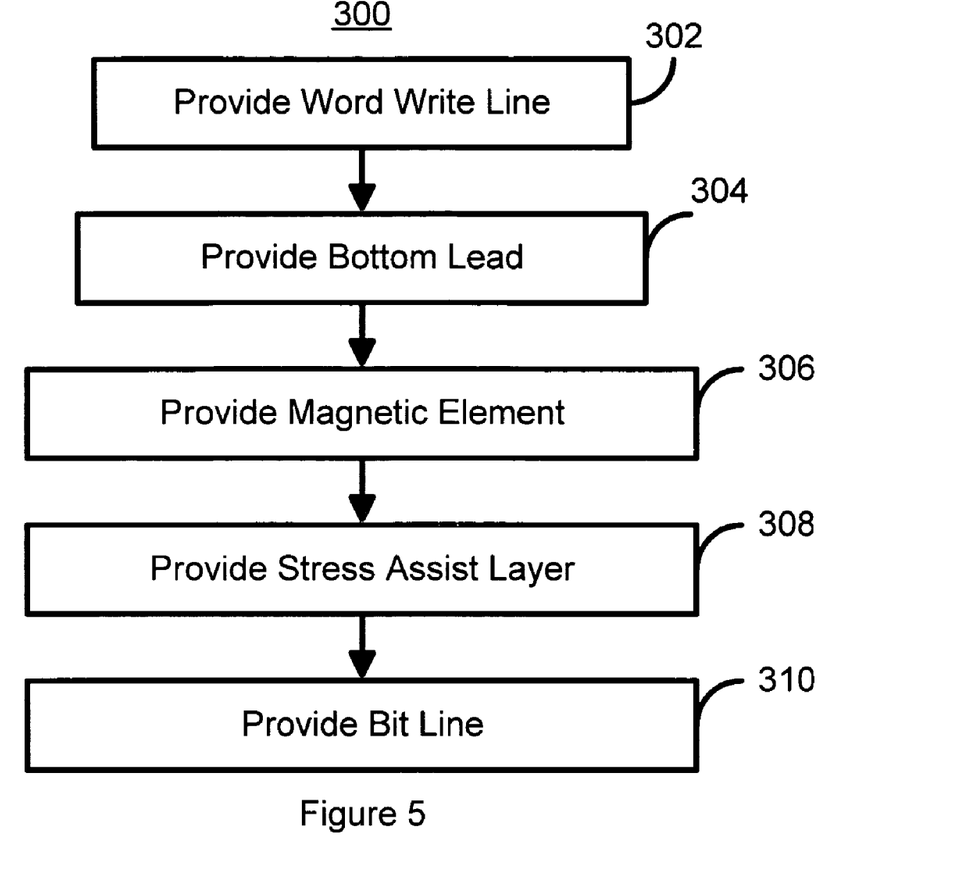
FIG. 5 is a high-level flow chart depicting one embodiment of a method for providing a magnetic memory utilizing stress assisted switching in accordance with the present invention.

FIG. 5 is a high-level flow chart depicting one embodiment of a method 300 for providing a magnetic memory utilizing stress assisted switching in accordance with the present invention. For clarity, the method 300 is described in the context of the magnetic memory 100. However, one of ordinary skill in the art will readily recognize that the method 300 could be used for other magnetic memories not inconsistent with the present invention.

The word write line 110 is provided, via step 302. The bottom lead 120 is also provided, via step 304. The magnetic element 130 is provided via step 306. The stress-assist layer 140 is provided, via step 308. Note that for the magnetic memory 100', the step 308 may be performed prior to the step 304. For the magnetic memory 100, steps 306 and 308 are performed such that the stress-assist layer 140 surrounds the sides of the magnetic element 130. The top lead is also provided, via step 310. Thus, magnetic elements 130 and 130' having the advantages of the magnetic memories 100 and 100' can be provided.

Figure 6:
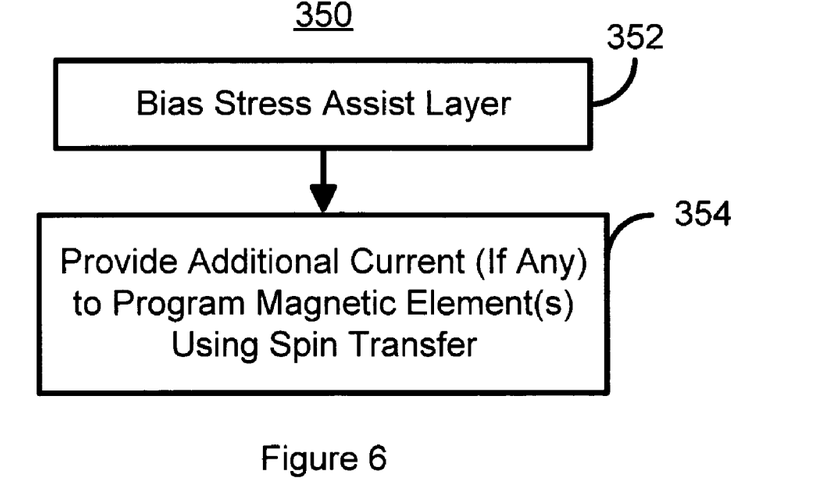
FIG. 6 is a high-level flow chart depicting one embodiment of a method for programming a magnetic memory utilizing stress assisted switching in accordance with the present invention.

FIG. 6 is a high-level flow chart depicting one embodiment of a method 350 for programming a magnetic memory utilizing stress assisted switching in accordance with the present invention. For clarity, the method 350 is described in the context of the magnetic memory 100'. However, one of ordinary skill in the art would readily recognize that the method 350 could be used for other magnetic elements not inconsistent with the present invention.

The stress-assist layer 140 is electrically biased such that the stress-assist layer 140 deforms to provide a tensile stress on the magnetic element 130, via step 352. For the magnetic element 130, step 352 is performed by driving a current through the magnetic element 130. However, for the magnetic element 130', step 352 is performed by providing a voltage difference between the bottom lead 120' and/or magnetic element 130' and the word write line 110'. Any additional write current required is driven through the magnetic element 130 to write the magnetic element 130 using spin transfer, via step 354. For the magnetic memory 100, step 352 is not required. Thus, for the magnetic memory 100, the same current which biases the stress-assist layer 140 also writes to the magnetic element 130. However, for the magnetic memory 100', a separate current is driven through the magnetic element 130'. Thus, the magnetic memories 100 and 100' can be written using the spin transfer phenomenon. In addition, a lower write current can be used because programming is performed using stress assisted spin transfer switching.

A method and system has been disclosed for providing a magnetic element in which data may be written using stress assisted switching. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing.
wherein each of the plurality of magnetic elements further includes a first lead and a second lead for driving current through the magnetic element in a perpendicular-to-a plane direction to allow the magnetic element to be written using spin transfer.

2. A magnetic memory comprising:
plurality of magnetic elements, each of the plurality of magnetic elements being configured to be written using spin transfer;
at least one stress-assist layer configured to exert at least one stress on at least one magnetic element of the plurality of magnetic elements during writing;
wherein the at least one stress induces at least one anisotropy on the at least one magnetic element during writing, the at least one anisotropy reducing a total anisotropy energy perpendicular to a stable state of the at least one magnetic element.

3. The magnetic memory of claim 1 wherein the magnetic element includes a plurality of layers and wherein the at least one stress is in a direction perpendicular to a plane of at least one of the plurality of layers.

4. The magnetic memory of claim 3 wherein at least one layer is a free layer.

5. The magnetic memory of claim 4 wherein the free layer includes a ferromagnetic layer and a capping layer, the free layer having a high positive magnetostriction.

6. The magnetic memory of claim 5 wherein the free layer has a surface anisotropy and a total anisotropy perpendicular to a stable state of the free layer, the capping layer configured to modify the surface anisotropy to reduce the total perpendicular anisotropy and capable of including Cu, Au, Pd or Pt.

7. The magnetic memory of claim 4 wherein the at least one magnetic element includes at least one spin tunneling junction.

8. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein at least one layer is a free layer; and
wherein the at least one magnetic element includes at least one spin valve.

9. A magnetic memory comprising:
a plurality of magnetic elements, each of the plurality of magnetic elements being configured to be written using a spin transfer;
at least one stress-assist layer configured to exert at least one stress on at least one magnetic element of the plurality of magnetic elements during writing;
wherein at least one layer is a free layer; and
wherein the at least one magnetic element includes at least one spin valve portion and at least one spin tunneling junction portion the at least one spin valve portion and the at least one spin tunneling junction portion sharing the free layer.

10. The magnetic memory of claim 9 wherein the at least one spin valve portion includes a first pinned layer having a first ferromagnetic layer closest to the free layer and wherein the at least one spin tunneling junction portion includes a second pinned layer having a second ferromagnetic layer closest to the pinned layer, the first ferromagnetic layer being pinned in a first direction, and the second ferromagnet layer being pinned in a second direction opposite to the first direction.

11. The magnetic memory of claim 1 wherein the at least one magnetic element has a plurality of sides and wherein the at least one stress-assist layer surrounds the plurality of sides of the at least one magnetic element.

12. The magnetic memory of claim 1 further comprising:
a plurality of word write lines; and
wherein the at least one stress-assist layer resides between the plurality of word lines and the at least one magnetic element.

13. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein the stress assist layer further includes bilayer of at least one of $IrO_2/PZT$, $MnO/PZT$, $TiO_2/PZT$, $Al_2O_3/PZT$, $Al_2O_3/PMN$, $Al_2O_3/SrBaTiO_3$, $SiO_2/PZT$ or $SiO_2/SrBaTiO_3$, where PZT is $PbZr_{1-x}Ti_xO_3$, wherein PMN is $PbMn_{1-x}Nb_xO_3$ with $PbTiO_3$ and wherein x is a fraction less than 1.

14. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein each of the plurality of magnetic elements includes a free layer having a first ferromagnetic layer having a first magnetization, a second ferromagnetic layer having a second magnetization, and a separation layer between the first ferromagnetic layer and the second ferromagnetic layer, the seperation layer configured to align the first magnetization and the second magnetization antiparallel.

15. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing, the stress-assist layer including at least one of a piezoelectric and an electrostrictive material;
wherein each of the plurality of magnetic elements further includes a first lead and a second lead for driving current through the magnetic element in a perpendicular-to-a plane direction to allow the magnetic element to be written using spin transfer.

16. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing, the stress-assist layer including at least one of a piezoelectric and an electrostrictive material;
wherein each of the plurality of magnetic elements includes a free layer having a first ferromagnetic layer having a first magnetization, a second ferromagnetic layer having a second magnetization, and a separation layer between the first ferromagnetic layer and the second ferromagnetic layer, the separation layer configured to align the first magnetization and the second magnetization antiparallel.

17. The magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein each of the plurality of magnetic elements has at least one layer and being configured to be written using spin transferof charge carriers polarized by at least one layer having an in-plane magnetization.

18. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein each of the plurality of magnetic elements further includes a ferromagnetic free layer and a non magnetic capping layer on the ferromagnetic free layer, the nonmagnetic capping layer reducing the perpendicular anisotropy of the ferromagnetic free layer.

19. A magnetic memory comprising:
a plurality of magnetic elements each of the plurality of magnetic elements being configured to be written using spin transfer;
at least one stress-assist layer configured to exert at least one stress on at least one magnetic element of the plurality of magnetic elements during writing;
wherein the at least one stress-assist layer being adjacent to a portion of each of the plurality of magnetic elements without residing above or below any of the plurality of magnetic elements.

20. A magnetic memory comprising:
a plurality of magnetic elements, each of the plurality of magnetic elements being configured to be written using spin transfer;
at least one stress-assist layer configured to exert at least one stress on at least one magnetic element of the plurality of magnetic elements during writing;
wherein the plurality of magnetic elements includes at least one ferromagnetic layer, each of the at least one ferromagnetic layer having an in-plane magnetization.

21. A magnetic memory comprising:
a plurality of magnetic elements, each of the plurality of magnetic elements being configured to be written using spin transfer;
at least one stress-assist layer configured to exert at least on stress on at least one magnetic element of the plurality of magnetic elements during writing, the stress-assist layer including at least one of a piezoelectric and an electrostrictive material;
wherein each of the plurality of magnetic elements further includes a ferromagnetic free layer and a nonmagnetic capping layer on the ferromagnetic free layer, the nonmagnetic capping layer reducing the perpendicular anisotropy of the ferromagnetic free layer.

22. A magnetic memory comprising:
a plurality of magnetic elements, each of the plurality of magnetic elements being configured to be written using spin transfer, each of the plurality of magnetic elements including a ferromagnetic free layer having an perpendicular anisotropy and a nonmagnetic capping layer on the ferromagnetic free layer, the nonmagnetic capping layer reducing the perpendicular anisotropy of the ferromagnetic free layer.

23. The magnetic memory of claim 22 wherein the ferromagnetic free layer includes at least one of Co, Fe, and Ni and wherein the nonmagnetic capping layer includes at least one of Pt, Pd, Au, Ta, and Cr.

* * * * *